United States Patent
Chen

(10) Patent No.: US 6,342,805 B1
(45) Date of Patent: Jan. 29, 2002

(54) SYSTEM AND METHOD FOR SELECTIVELY CONNECTING ONE OF AT LEAST TWO OUTPUTS OF AN ASSOCIATED CIRCUIT TO AN OUTPUT NODE

(75) Inventor: Zhenhai Chen, Bedford, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/594,240

(22) Filed: Jun. 15, 2000

(51) Int. Cl.[7] .............................................. H03K 17/62
(52) U.S. Cl. ......................... 327/407; 327/278; 327/65
(58) Field of Search ........................ 327/91, 104, 407, 327/409, 410, 531, 65, 278; 365/207; 330/252, 253

(56) References Cited

U.S. PATENT DOCUMENTS

| | | | |
|---|---|---|---|
| 4,616,189 A | * 10/1986 | Pengue, Jr. ................. 330/253 |
| 4,672,230 A | 6/1987 | Spahn ........................ 307/116 |
| 4,672,233 A | 6/1987 | Scott ......................... 307/141 |
| 4,820,935 A | 4/1989 | Gontowski ................. 307/112 |
| 4,958,251 A | 9/1990 | Cini et al. .................... 361/84 |
| 5,063,311 A | * 11/1991 | Swapp ........................ 327/278 |
| 5,712,568 A | * 1/1998 | Flohr et al. ................. 324/434 |
| 5,744,956 A | * 4/1998 | Hawks ........................ 324/253 |

* cited by examiner

Primary Examiner—Kenneth B. Wells
Assistant Examiner—Paul Dinh
(74) Attorney, Agent, or Firm—Himanshu S. Amin; Alexander M. Gerasimow; William R. Walbrun

(57) ABSTRACT

A system and method for selecting an output of an associated circuit includes a pair of inputs for receiving different relative voltage levels. A first switch is operatively coupled to a first of the inputs and a second switch operatively coupled to a second of the inputs. Each of the first and second switches operates mutually exclusively according to the voltage potential between the pair of inputs. A third switch is operatively coupled between a first output of the associated circuit and the first switch. When the third switch is activated in response to activation of the first switch, it couples the first output to an output node. The system further includes a fourth switch operatively coupled between a second output of the associated circuit and the second switch. When the fourth switch is activated in response to activation of the second switch, it couples the second output to the output node.

15 Claims, 4 Drawing Sheets

US 6,342,805 B1

SYSTEM AND METHOD FOR SELECTIVELY CONNECTING ONE OF AT LEAST TWO OUTPUTS OF AN ASSOCIATED CIRCUIT TO AN OUTPUT NODE

TECHNICAL FIELD

The present invention generally relates to output selection and, more particularly, to a system and method for selectively connecting one of at least two outputs of an associated circuit to an output node, such as to provide a selectable switch mode.

BACKGROUND

Various types of proximity sensors are used for detecting the presence or absence of an object relative to a monitored zone. Common types of non-contact proximity sensors include inductive proximity sensors, capacitive proximity sensors, ultrasonic proximity sensors, and photoelectric sensors. Such sensors, for example, may be used in motion or position applications, conveyor system control applications, process control applications, robotic welding applications, machine control applications, liquid level detection applications, as well as other applications.

One type of proximity sensor circuit employs a non-contact, solid state electronic switch that turns ON and OFF in response to detecting the presence or absence of a target within a monitored zone. By way of example, the sensor is an inductive proximity sensor that includes an oscillator for providing an oscillating signal to an inductive coil, which provides an electromagnetic field. As an electrically conductive target moves within the field, eddy currents develop within the target in response to the oscillating electromagnetic field. The eddy currents alter the amplitude of the oscillating signal being provided to the coil. The amplitude of the oscillator signal typically is evaluated to provide an output signal indicative of the presence or absence of the object within the electromagnetic field. The sensor provides an output signal based on the sensed amplitude of the oscillating signal.

The output signal may be utilized to control part of a process or a machine based on the sensed presence (or absence) of a target within a zone monitored by the sensor. For example, an associated motor may be activated when the sensor signal indicates the presence of a target within the monitored zone and deactivated when no target is within the zone. Some implementations, however, may require a different operating mode based on the sensor signal. For example, it may be desirable to deactivate a motor when a target is sensed to be within the monitored zone and activate it when no target is within the zone.

In order to accommodate both types of switch operating modes, two types of electronic switching devices are used in connection with proximity sensors, namely, normally open and normally closed switching devices. In order to help minimize inventory requirements, some electric switching devices (integrated circuits) include two complementary outputs; one output corresponding to a normally open operating mode and the other a normally closed operating mode. While the dual operating mode circuit reduces inventory requirements, the individual installing the system must properly connect the switch so as to provide the desired type of output signal.

Switch circuits have been proposed that operate in a normally-open or normal closed operating according to the circuit's connection to a supply voltage. U.S. Pat. No. 5,229,653, for example, discloses a connection programmable electronic switching device that operates in a different mode depending on the polarity at which the device is connected to an external power supply. The '653 patent discloses a two-wire input circuit in which power inputs serve a dual function, acting as both a power source for the switching circuit and as an output for the circuit. The switching circuit includes two electronic switches. Each switch is controlled to carry current from an associated complementary output only in one direction to a power input depending on the polarity of the power inputs.

SUMMARY

The present invention relates to a system and method for selectively connecting one of at least two outputs of an associated circuit to an output node based on the relative voltage between a pair of power supply inputs. The system includes a first pair of switches, each of which is coupled to a respective one of the power supply inputs so as to operate in a mutually exclusive manner based on the relative voltage potential between the inputs. That is, when the system is connected to a power source in a first manner, one switch of the first pair of switches is ON (or closed) and the second switch is OFF (or open). When the system is connected to the power source in another manner, the one switch is OFF (or open) and the other switch is ON (or closed). Each switch of the first pair of switches is coupled to a control input of a second pair of switches, each of which is coupled to a different corresponding output of an electronic switch control circuit, such as a proximity sensor circuit. Each switch of the second pair of switches is activated in response to activation of its associated switch of the first pair of switches. When a first switch of the second pair of switches is activated, one of the outputs is coupled to an output node. When a second switch of the second pair of switches is activated, the other output is coupled to the output node.

The outputs of the control circuit, for example, are complementary outputs, in which each output corresponds to a different operating mode of the control circuit. For example, one output may provide a control signal for a normally-open operating configuration and the other provide a control signal for a normallyclosed operating configuration. Therefore, depending on the connection of the inputs to a power supply, the electronic switch may be connected to the power supply so as to operate either in a normally open configuration or a normally closed configuration, with a corresponding output signal being provided to the output node. By way of example, the output node may be employed to control an actuatable component or device based on the operating condition of the control circuit. As a result, end users (e.g., customers) that require both normally-open and normally closed switch configurations need only stock a single type of switch circuit, in accordance with an aspect of the present invention.

Another aspect of the present invention provides a system for selectively connecting one of at least two outputs of an associated circuit to an output node. The system includes a pair of inputs for receiving different relative voltage levels. A first switch is operatively coupled to a first of the inputs and a second switch operatively coupled to a second of the inputs. Each of the first and second switches operates mutually exclusively according to the voltage potential between the pair of inputs. A third switch is operatively coupled between a first output of the associated circuit and the first switch. When the third switch is activated in response to activation of the first switch, it couples the first output to the output node. The system further includes a fourth switch operatively coupled between a second output of the associated circuit and the second switch. When the fourth switch is activated in response to activation of the second switch, it couples the second output to the output node.

Yet another aspect of the present invention provides a system for selecting an operating mode of a proximity sensing circuit. The system includes input means for coupling to a source of electrical energy to apply a voltage potential across the input means. A first pair of switch means is operatively coupled to the inputs means. When each switch means of the first pair of switch means is activated, it activates a corresponding one of a second pair of switch means based on the voltage potential across the pair of input means. One of the second pair of switch means and one of the first pair of switch means are operative to connect one output of at least two outputs of the proximity sensing circuit to an output node based on the relative voltage across the input means. Another of the second pair of switch means and another of the first pair of switch means are operative to connect another output of the at least two outputs of the proximity sensing circuit to the output node based on the relative voltage across the input means.

Still another aspect of the present invention provides a method for selectively connecting one of at least two outputs of an associated circuit to an output node based on a relative voltage potential between a pair of inputs. The method includes electrically coupling the pair of inputs to a source of electrical energy to apply a relative voltage potential across the pair of inputs. One switch of a first pair of switches is selectively activated based on the voltage potential across the pair of inputs. One switch of a second pair of switches is activated in response to the activated one of the first pair of switches. One output of the at least two outputs is connected to the output node based on which one of the second pair of switches is activated.

To the accomplishment of the foregoing and related ends, the invention, then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

DESCRIPTION OF THE INVENTION

Figure 1:
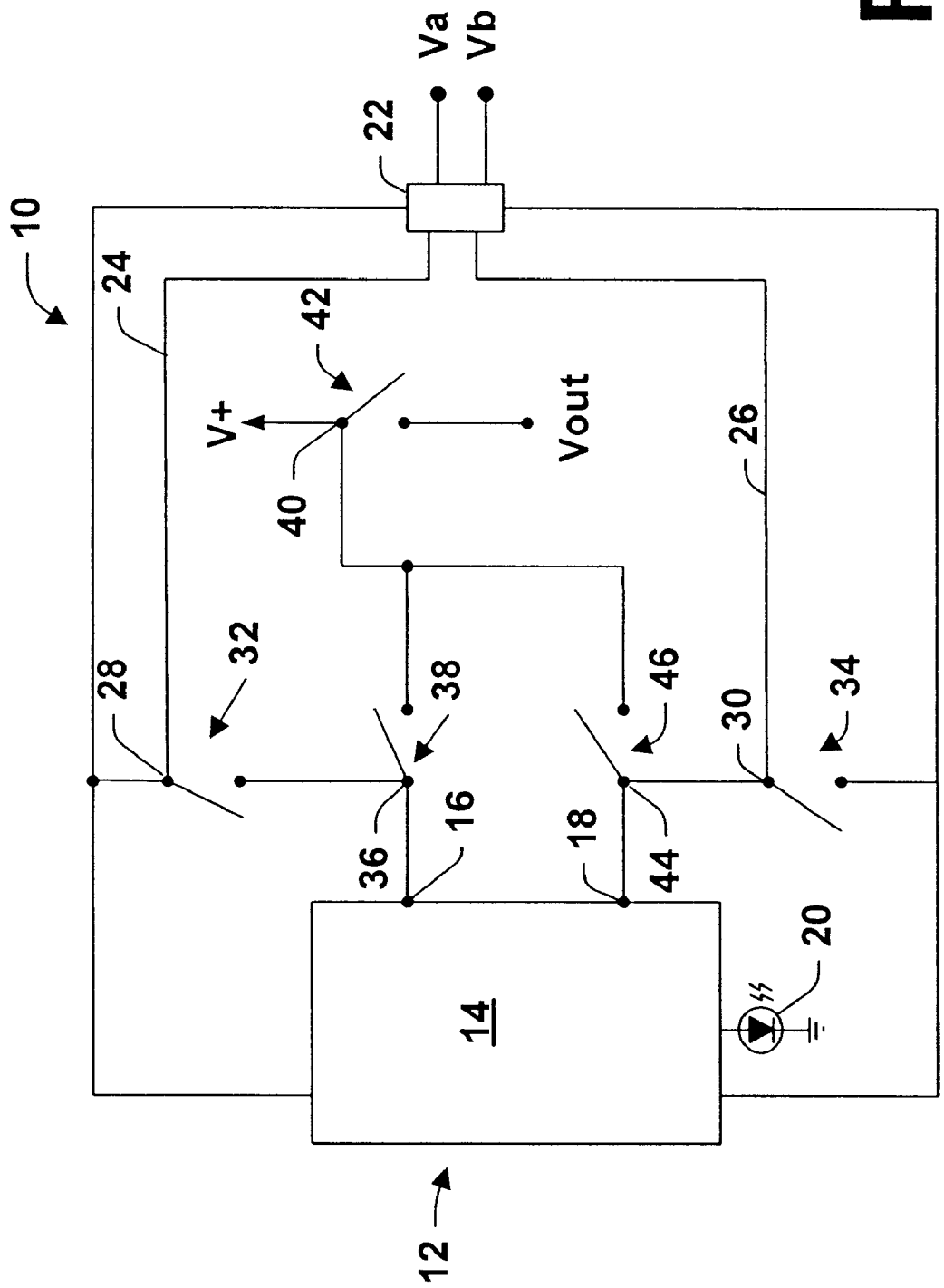
FIG. 1 is a schematic representation of a system in accordance with the present invention.

FIG. 1 illustrates an electronic switching system 10 implemented in conjunction with an associated sensing system 12. The sensing system 12 may be a proximity sensor, a presence detector (e.g., inductive proximity sensors, capacitive proximity sensors, ultrasonic proximity sensors, and photoelectric sensors) or other type of sensing circuit, such as for sensing the presence or absence of a target within a monitored zone.

The sensing system 12 includes a sensor and a controller, collectively indicated at 14, having two or more outputs 16 and 18. The controller 14 provides an output signal to each of the outputs 16 and 18 indicative a whether a target is sensed within the zone. The outputs 16 and 18, for example, may be complementary outputs. The controller 14 may be an integrated circuit programmed and/or configured to perform a desired sensing function and provide complementary output signals at the outputs 16 and 18. It is to be understood and appreciated that the functions performed by the controller 14 could be carried out by discrete digital circuitry, analog circuitry, a combination of analog and digital circuitry, and may be implemented as an application specific integrated circuit ("ASIC").

By way of example, the output 16 corresponds to a normally-open switch mode of the controller 14 and the output 18 corresponds to a normally-closed operating mode of the controller. Normally open refers to an operating mode of a switch mode control circuit of the controller 14 that is OFF (or open) in the absence of a target within the monitored zone of the sensing system 12 and is ON (or closed) when a target is sensed within the monitored zone. In contrast, normally closed refers to an operating mode of a switch mode control circuit of the controller 14 that is ON (or closed) when no target is within the monitored zone and is OFF (or opened) when a target is sensed within the monitored zone.

The controller 14 also includes another output for controlling activation of an indicator 20, such as a light source or other type of indicator device. The controller 14 controls activation of the indicator 20 according to whether the sensing system 12 detects the presence or absence of target within a zone monitored by the sensing system. The controller 14 further may be configured to control activation of the indicator 20 depending upon whether the system 10 is configured to operate in a normally-open or normally closed switch mode. As set forth in greater detail below, the operating mode of the system 10 is selected according to the voltage potential between a pair of inputs a pair of inputs $V_a$ and $V_b$.

The switching system 10 includes a pair of inputs $V_a$ and $V_b$ that are connectable to a source of electrical energy (not shown), such as a DC power supply. Each of the inputs $V_a$ and $V_b$ is connected to a different relative voltage level. As set forth below, the relative voltage potential between the inputs $V_a$ and $V_b$ controls the operation of the switching system 10 in accordance with an aspect of the present invention.

The inputs $V_a$ and $V_b$ are operatively connected to an input circuit (or system) 22 for directing electrical energy from each of the inputs to the rest of the switching system 10, including to the controller 14. The input circuit 22 is connected to respective control inputs 28 and 30 of corresponding switch devices 32 and 34 via respective connections 24 and 26 for providing signals to control operation of the switch devices. The input circuit 22 also is connected between the controller 14 and the inputs $V_a$ and $V_b$, such as to provide electrical energy to the controller according to the relative voltage of the inputs. The input circuit 22, for example, may be in the form of a bridge rectifier formed of two pairs of diodes connected in anti-parallel between the inputs $V_a$ and $V_b$. The input circuit 22 cooperates with the switches 32 and 34 so that each switch device operates mutually exclusively (one switch is ON when the other is OFF and vice versa).

The switch device 32 is operatively connected between a voltage potential, as provided by the input circuit 22, and a control input 36 of another switch device 38. The switch device 38 is operatively connected between the first switched output 16 of the controller 14 and an output node 40, which may be a control input of an output switch 42. Accordingly, the output 16 is operatively connected to the control input 40 of the switch 42 when the switch 38 is activated to the closed condition in response to activation of the switch 32.

The switch 34 also is operatively coupled to a voltage potential, which is provided by the input circuit 22, and to a control input 44 of a switch device 46. The switch device 46 is operatively coupled between the other output 18 of the controller 14 and the output node 40. As a result, when the switch 46 is activated to the closed position (in response to activation of the switch 34), the switched sensor output 18 is operatively coupled with the output node 40 corresponding to the control input of the switch 42. The operation of each associated switch 32, 34, thus, controls the activation of each of the switches 38 and 46 respectively. The operation of each of the switches 32 and 34 is further controlled in response to the voltage potential between inputs $V_a$ and $V_b$.

Figure 1A:
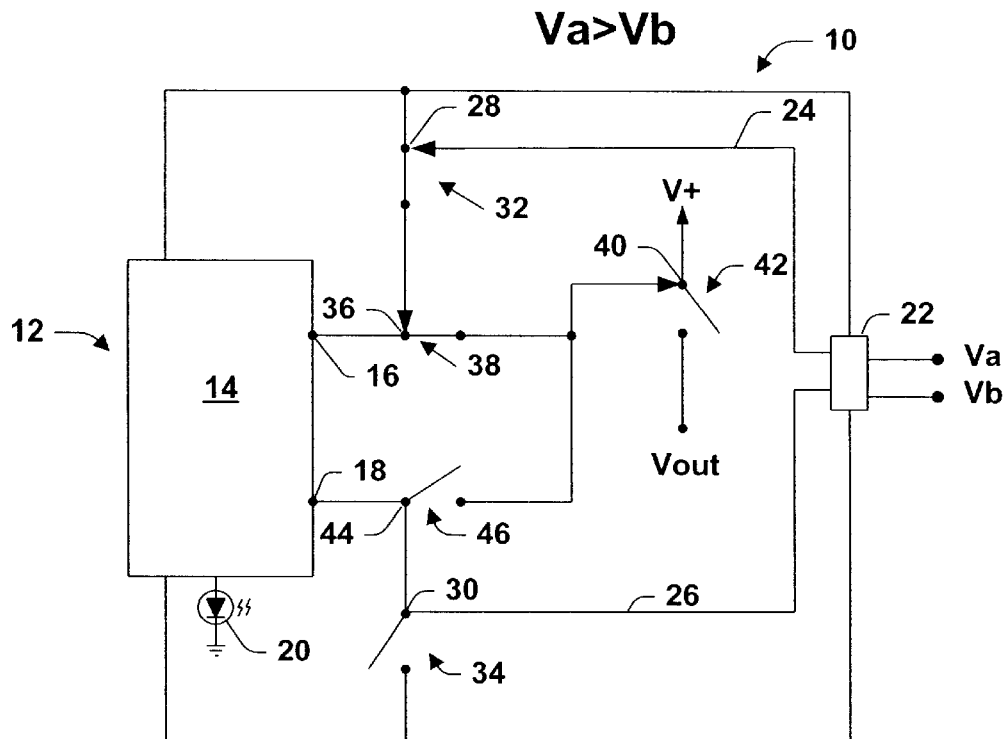
FIG. 1a is a schematic representation of the circuit of FIG. 1, illustrating a first operating condition thereof in accordance with the present invention.
Figure 1B:
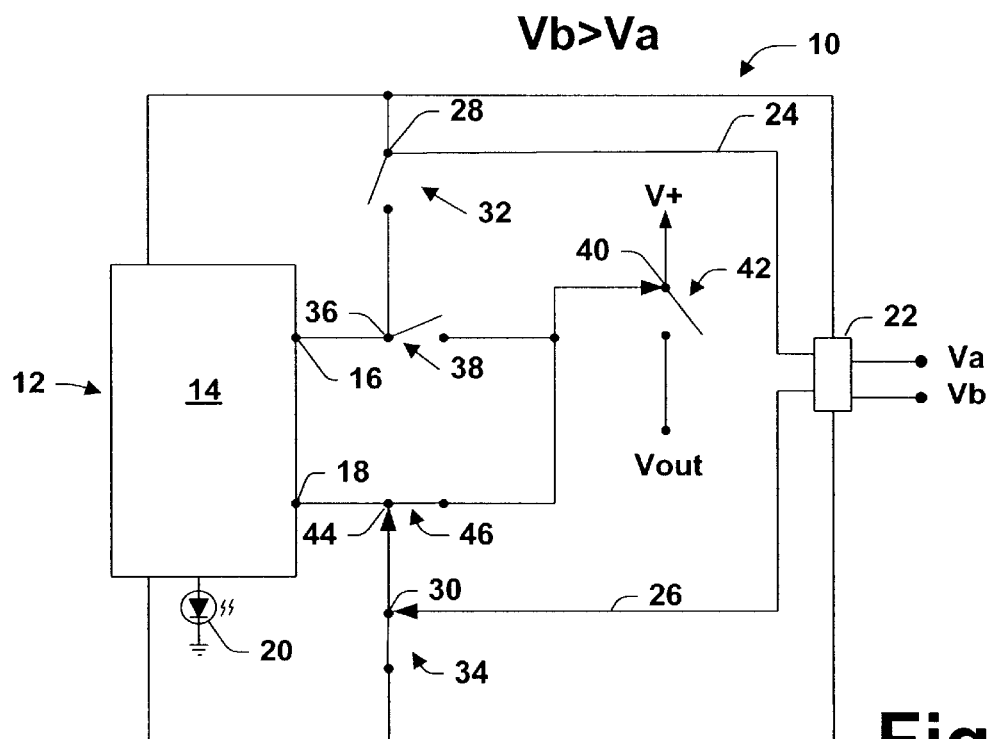
FIG. 1b is a schematic representation of the circuit of FIG. 1, illustrating a second operating condition thereof in accordance with the present invention.

FIGS. 1a and 1b illustrate possible operating conditions of the system 10 of FIG. 1 according to the two possible relative voltage conditions between $V_a$ and $V_b$. In particular, $V_a$ is either greater than or less than $V_b$ when the system input terminals are connected to a DC power supply.

FIG. 1a represents a situation when the system 10 operates in a first operating mode (e.g., a normally-open mode) in response to the voltage at input $V_a$ being greater than $V_b$. As a result, the input circuit 22 cooperates with the switches 32 and 34 so as to provide an activation signal to the control input 28 via the connection 24. The switch 32 is activated to the closed condition (as illustrated) in response to the control input signal, which provides a control input signal to the control input 36 of the switch 38. The switch 38, in turn, is activated to a closed condition (as illustrated), thereby connecting the output 16 of the controller 14 through the switch 38 and to the output node 40. As a result, the switched output signal provided by the controller 14 at the output 16 controls operation of the output switch 42.

By way of example, the sensor system 12 is a proximity sensor in which the output 16 corresponds to a normally-open switched output of the sensor for providing a sensor signal indicative whether a target is detected within a zone monitored by the sensor. When no target is sensed to be within the monitored zone, the controller 14 provides a first output signal (e.g., a logic LOW voltage signal) at the output 16. The output control switch 42 remains OPEN and ,thus, no voltage or current is provided at $V_{out}$. In contrast, when the sensor detects a target within the monitored zone, the output signal at 16 provides a second, different output signal (e.g., a logic HIGH voltage signal). The logic HIGH output signal at the output 16, in turn, activates the output switch 42 to the closed condition, which results in voltage and/or current being provided to $V_{out}$ according to the voltage $V_+$ to which the switch 42 is connected. Accordingly, the different output signals provided at the output 16 control the operation of the switch device 42 between different operating conditions (eg., open and closed conditions).

The output $V_{out}$ may be employed to control the operation of an associated actuatable system or component (e.g., a motor).

FIG. 1b represents a situation when the system 10 operates in a second operating mode (e.g., a normally-closed mode) in response to the voltage at input $V_a$ being less than the voltage at the input $V_b$. The input circuit 22 cooperates with the switches 32 and 34 so as to provide an activation signal to the control input 30 via the connection 26. The switch device 32 is deactivated (or operates in an OPEN condition). The signal provided to the input 30 activates the switch 34 to the closed condition (as illustrated), which results in a control input signal being provided to the input 44 of the switch 46. The input signal, in turn, activates the switch 46 to a closed condition (as illustrated), thereby connecting the output 18 of the controller 14 through the switch 46 to the output node 40. As a result, the switched output signal provided by the controller 14 at the output 18 is coupled to the output node 40 to control operation of the output switch 42.

Continuing with the example given with respect to FIG. 1a when the sensor system 12 is a proximity sensor, the output 18 is complementary to the output 16. The output 18 corresponds to a normally-closed switched output of the sensor 12 for providing a sensor signal indicative whether a target is detected within a zone monitored by the sensor. That is, when no target is sensed to be within the monitored zone, the controller 14 provides a first switched output signal (e.g., a logic HIGH voltage signal) at the output 18. The HIGH signal at the output 18 activates the output control switch 42 to the CLOSED condition, thereby providing voltage and/or current to $V_{out}$ based on the voltage $V_+$. When the sensor detects a target within the monitored zone, the output signal at 18 provides a second, different output signal (e.g., a logic LOW voltage signal). The LOW output signal at the output 18 controls the switch 42, for example, to operate in an OPEN operating condition, in which no voltage or current is supplied to $V_{out}$.

In view of the foregoing, those skilled in the art will appreciate that a system 10, in accordance with the present invention, may be employed to provide an electronic switch having a selectable switch mode according to how the inputs $V_a$ and $V_b$ are connected to a power supply.

Figure 2:
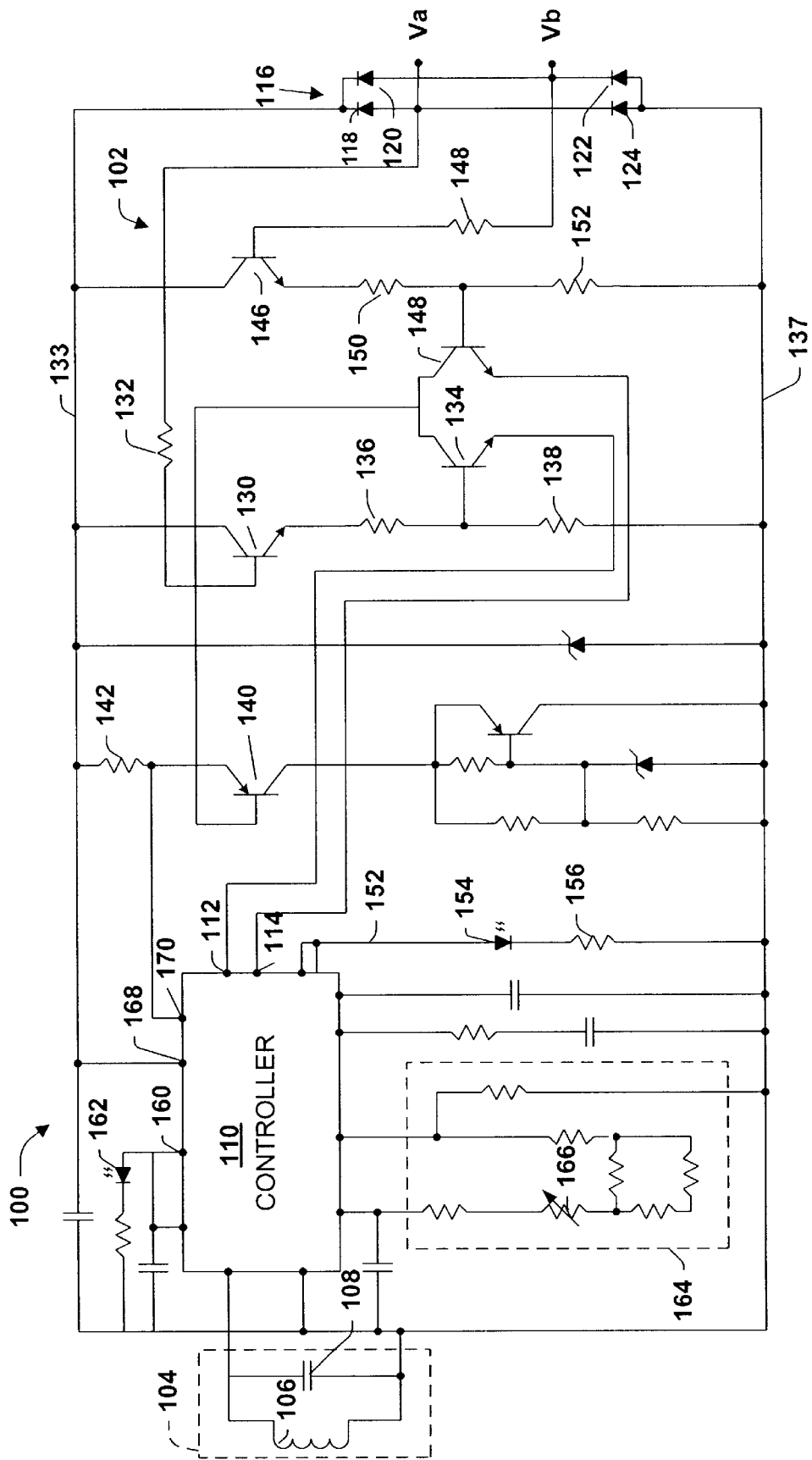
FIG. 2 is a circuit diagram of a proximity sensing system including a switching system in accordance with the present invention.

FIG. 2 illustrates an example of a proximity sensing system 100 employing a switch selection system 102 in accordance with an aspect of the present invention. The system 100 includes power supply inputs $V_a$ and $V_b$ for providing DC power to the system. The system 100 also includes a sensor circuit 104 that is operative to detect the presence or absence (or proximity) of a target relative to a monitored zone. The sensor circuit 104, for example, may be a non-contact proximity sensor, such as an inductive proximity sensor, a capacitive proximity sensor, an ultrasonic proximity sensor, a photoelectric sensor, or other known type of sensor.

In the example of FIG. 2, the sensor circuit 104 is an oscillator formed of an inductor 106 and a capacitor 108. The oscillator provides an oscillating signal that varies according to the presence or absence (or proximity) of an object or a target located within the monitored zone. The inductor 106 provides an oscillating electromagnetic field. As a target moves within the oscillating electromagnetic field, eddy currents develop within the target in response to the field. The eddy currents alter the amplitude of the oscillating signal that is provided to the inductor 106.

The oscillating signal is provided to and monitored by a controller 110. The controller 110, in turn, provides a switched output signal indicative of the presence or absence of the target within the monitored zone based on the oscillating signal. In accordance with the aspect of the present invention, the controller 110 includes two or more outputs 112 and 114 for providing complementary switched output signals in response to activation of an internal switch within the controller indicative of the sensed condition. The controller 110 may be an integrated circuit, a plurality of discrete circuits, analog circuits, or a combination thereof configured to provide desired output signals.

The power supply inputs $V_a$ and $V_b$ are operatively coupled to a diode A bridge circuit 116 formed of diodes 118, 120, 122, and 124. Electric current flows through the diode bridge circuit 116 depending on the voltage potential between inputs $V_a$ and $V_b$. The input $V_a$ is connected to a base of a transistor switch device 130 through a current limiting resistor 132. A collector of the transistor 130 is operatively coupled to an output node 133 of the diode bridge circuit 116 for receiving electrical energy based on the relative voltage level between the inputs $V_a$ and $V_b$. An emitter of the transistor 130 is coupled to a base of another transistor switch 134 through a resistor 136. The base of the transistor 134 also is operatively coupled to another output node 137 of the diode bridge circuit 116 through another resistor 138. The resistors 136 and 138 form a voltage divider for providing a control voltage at the base of the transistor 134 so as to control its operation when the transistor 130 is activated to the ON condition. The emitter of the transistor switch 134 is coupled to the output 112 of the controller 110. The collector of the transistor 134 is operatively coupled to a base of a transistor 140. The transistor 140 may be employed to provide a switched output signal, such as to provide electrical energy (voltage/current) to an external load. By way of example, the external load may be a motor, an actuator, or another electrically controllable device that one may desire to control operation of based on a proximity sensor. An emitter of the transistor switch 140 is coupled to the node 133 through a current limiting resistor 142.

The power supply input $V_b$ is operatively coupled to a base of a transistor switch 146 through a current limiting resister 148. A collector of the transistor 146 is coupled to the node 133 and an emitter of the transistor switch 146 is connected to provide a control signal to a base of another transistor switch 148. In particular, base of the transistor 148 is connected between resistors 150 and 152 that form a voltage divider coupled between the emitter of the transistor 146 and the node 137. The voltage divider ensures that a suitable activation voltage will be provided at the base of the transistor switch 148 when the transistor 146 is activated to an ON condition. An emitter of the transistor 148 is operatively coupled to the output 114 of the controller 110. A collector of the transistor 148 is operatively coupled to the base of the transistor 140 to which the collector of the transistor 134 also is connected.

In view of the foregoing description, the output selection system 100 operatively couples one of the outputs 112 or 114 to the base of the transistor switch 140 according to the relative voltage potential between power supply inputs $V_a$ and $V_b$. Assume, for purpose of simplicity of explanation, that when the transistors 130, 134, 140, 146, and/or 148 are activated, they operate in the saturation mode and that the voltage drop across each of the associated transistor switches is negligible.

The output transistor switch 140 is controlled by one of the outputs of the controller 112 or 114 based on the relative voltage potential between inputs $V_a$ and $V_b$. Specifically, when $V_a$ is greater than $V_b$, transistor switch 130 is activated to the ON condition and the transistor 146 is OFF. This causes an electric current to flow through the voltage divider of resistors 136 and 138 to provide an activation voltage to occur at the base of the transistor 134. The activation voltage activates the transistor 134 to the ON condition, thereby electrically coupling the output 112 to the base of the transistor 140. In contrast, when $V_b$ is greater than $V_a$, the transistor 146 is activated to the ON condition and transistor 130 is OFF, which causes an activation voltage to occur at the base of the transistor 148. The activation voltage activates the transistor 148 to the ON condition, thereby electrically coupling the output 114 to the base of the transistor 140.

In order to provide additional context for the system 110, the controller 110 may include an indicator output 152 for providing a switched output signal indicative of the condition sensed by the sensor 104. The output 152 thus provides an output signal to a light emitting diode 154 coupled in series with a current limiting resistor 156 between the output 152 and the node 137. The output 152, for example provides an output signal (e.g., either ON or OFF) according to whether an internal switch of the controller 110 is open or closed. It is to be understood and appreciated, however, that instead of providing two output conditions at the LED 154, the controller 110 also could be controlled to provide an output signal at 152 indicative of the proximity of a target relative to the sensor 104 so as to vary its brightness according to the proximity of the target. Similar corresponding outputs also could be provided at the outputs 112 and 114 so as to control the operation of the output switch 140 in its active region rather than saturation.

For purposes of context, the controller 110 also provides an output signal at an output 160 to control operation of an LED 162, such as to provide an indication that the sensor circuit 100 is receiving electrical power. The sensor system 100 also may include a sensitivity adjustment circuit 164 including a variable resistor 166, which may be adjusted by a user for controlling the sensitivity of the proximity sensor. The controller 110 also may be programmed and/or configured to monitor the voltage at inputs 168 and 170 for sensing the electrical current through the resistor 142. The controller 110, in turn, may control operation of the sensor circuit 100 so as to mitigate excessive load current through the transistor 140 (when activated). For example, the controller 110 may be configured to disable the outputs 112 and 114 in response to the current through the resistor 142 exceeding a predetermined voltage, such as, for example, 300 milliamps.

While the example of FIG. 2 illustrates transistor switches being employed in the circuit, those skilled in the art will understand and appreciate that other types of switch devices may also be used. For example, the switches could be implemented as analog circuitry (e.g., thyristors, triacs, relays, etc.), appropriately configured digital circuitry, software, or a combination thereof.

Figure 3:
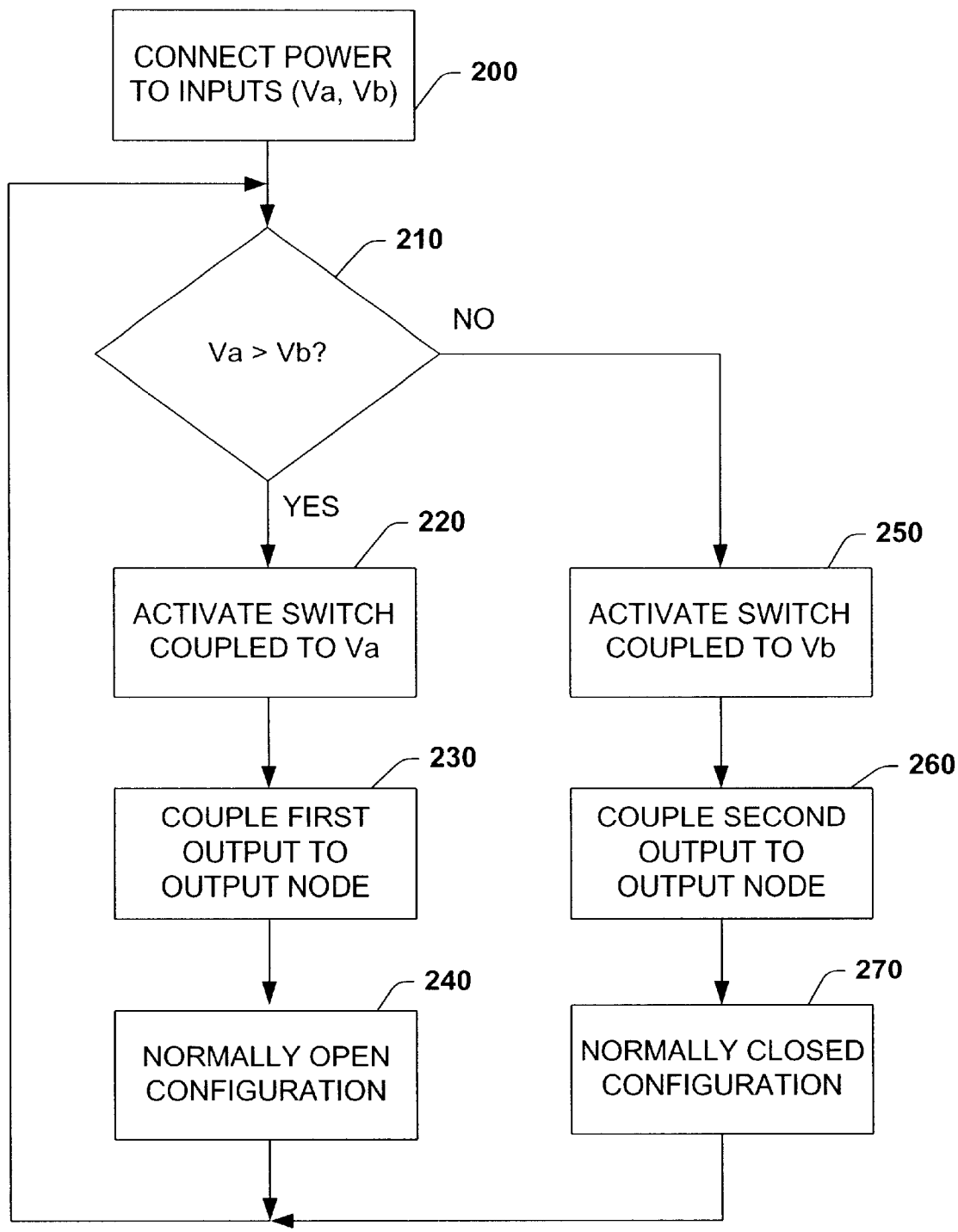
FIG. 3 is a flow diagram illustrating a methodology for selecting an output mode of an electronic switch device in accordance with the present invention.

In view of the exemplary system components described above with respect to FIGS. 1–2, a methodology for selecting a switch mode, in accordance with an aspect of the present invention, will be better appreciated with reference to FIG. 3. It is to be understood and appreciated that the present invention is not limited by the order of steps, as some steps may, in accordance with the present invention, occur in different orders and/or concurrently with other steps from that shown and described herein. Moreover, not all illustrated steps may be required to implement a methodology in accordance with the present invention.

In order to provide context for the methodology, reference may be made back to the structure illustrated in FIGS. 1–2.

Briefly stated, two inputs are connected to control operation of a first pair of respective switches based on the relative voltage between the inputs. Each switch of the first pair switches is, in turn, connected to control operation of another associated switch. Each associated switch operates to connect an output of an associated system (or circuit) to a common output node.

Referring to FIG. 3, the methodology begins at step 200 in which a pair of inputs ($V_a$ and $V_b$) is connected to different voltage levels associated with a source of electrical energy, such as to different outputs of a DC power supply, so that a voltage potential exists across the inputs. The methodology then proceeds to step 210.

At step 210, a determination is made as to whether $V_a$ is greater than $V_b$. This determination may be implemented in an electrical circuit or as computer executable instruction running on a computer. If $V_a$ is greater than $V_b$, one of the first pair of switches (e.g., the switch coupled to $V_a$) is activated (step 220) and the other switch (the one coupled to $V_b$) remains deactivated (or operates in an open condition). Activation of the switch results in corresponding activation of its associated switch, which, in turn, results in the first output of the associated system being coupled to the output node (step 230). This establishes a first operating mode of the system, such as a normally-open configuration (step 240). From step 240, the process returns to step 210 in which the operating configuration may be modified, such as by reconnecting the inputs of the system in a different manner.

If the determination at step 210 is negative, the process proceeds to step 250 in which the switch connected to $V_b$ is activated (or closed) and the switch coupled to $V_a$ is deactivated (or operates in an open condition). Next, at step 260 a second output of the associated circuit is coupled to the output node. Step 260 may be implemented, for example, in response to an associated switch being activated in response to activation of the switch (e.g., the switch connected to $V_b$) at step 250. The process then proceeds to step 270, in which a different operating configuration is established, such as a normally-closed configuration. The process then returns to step 210.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising".

What is claimed is:

1. A system comprising:
    a proximity sensor circuit operative to sense proximity of a target relative to a zone monitored by the proximity sensor circuit, the proximity sensor circuit having at least two outputs and providing complementary output signals at at least first and second of the at least two outputs based on proximity of a target;
    a pair of inputs for receiving different relative voltages;
    a first switch operatively coupled to a first of the inputs;
    a second switch operatively coupled to a second of the inputs, each of the first and second switches operating mutually exclusively according to the voltage potential between the pair of inputs;
    a third switch operatively coupled to the first output of the proximity sensor circuit and the first switch, the third switch, when activated in response to activation of the first switch, coupling the first output to the output node; and
    a fourth switch operatively coupled between the second output of the proximity sensor circuit and the second switch, he fourth switch, when activated in response to activation of the second switch coupling the second output to the output node.

2. The system of claim 1, wherein the output node is operatively coupled to a control input of a fifth switch, whereby one of the first and second outputs is provided at the control input of fifth switch according to the relative voltage potential between the first and second inputs.

3. The system of claim 2, wherein the first and second switches are transistors.

4. The system of claim 1, wherein the first output provides an output signal corresponding to a normally-open operating mode of the proximity sensor circuit.

5. The system of claim 4, wherein the second output provides an output signal corresponding to a normally-closed operating mode of the proximity sensor circuit.

6. The system of claim 1, wherein the proximity sensor circuit further includes a third output for providing a switched output signal based on the proximity of the target relative to the monitored zone, the third output coupled to an indicator, the proximity sensor circuit providing an output signal at the third output to: (a) activate the indicator to a first operating condition when the target is within the monitored zone and the voltage at a first of the inputs is greater than the voltage at a second of the inputs; (b) activate the indicator to a second operating condition when the target is not within the monitored zone the voltage at a first of the inputs is greater than the voltage at a second of the inputs; (c) activate the indicator to the second operating condition when the target is within the monitored zone and the voltage at the first of the inputs is less than that at the second of the inputs; and (d) activate the indicator to the first operating condition when the target is within the monitored zone and the voltage at the first of the inputs is less than that at the second of the inputs, whereby the indicator provides a dual purpose, namely, indicating the position of a target within the monitored zone sensor circuit and the operating switch mode of the sensor circuit based on the relative voltage potential between the first and second inputs.

7. A system for selecting an operating mode comprising:
    proximity sensing means having at least two outputs;
    input means for coupling to a source of electrical energy to apply a voltage potential across the input means; and
    a first pair of switch means operatively coupled to the inputs means, each switch means of the first pair of switch means for, when activated, activating a corresponding one of a second pair of switch means based on the voltage potential across the pair of input means, one of the second pair of switch means and one of the first pair of switch means being operative to connect one output of the at least two outputs of the proximity sensing means to an output node according to the voltage potential across the input means another of the second pair of switch means and another of the first pair of switch means being operative to connect another output of the at least two outputs of the proximity sensing means to the output node according to the voltage potential across the input means.

8. The system of claim 7, further including output switch means operatively coupled to the output node, whereby one of the at least two outputs is electrically coupled to control the output switch means according to the relative voltage potential across the input means.

9. The system of claim 8, wherein the at least two outputs of the proximity sensing circuit provide complementary output signals indicative of a proximity of the target.

10. The system of claim 9, wherein the one output of the at least two outputs provides an output signal corresponding to a normally-open operating mode of the proximity sensing circuit.

11. The system of claim 10, wherein the another output of the at least two outputs provides an output signal corresponding to a normally-closed operating mode of the proximity sensing circuit.

12. A method comprising:
providing complementary output signals from at least two outputs of a proximity sensor indicative of the proximity of a target;
electrically coupling a pair of inputs to a source of electrical energy to apply a voltage potential across the pair of inputs;
selectively activating one switch of a first pair of switches based on the voltage potential across the pair of inputs;
activating one switch of a second pair of switches in response to the activated one of the first pair of switches; and
connecting one output of the at least two outputs to an output node based on which one of the second pair of switches is activated.

13. The method of claim 12, further including controlling operation of an output switch operatively coupled to the output node according to which output of the at least two outputs is connected to the output node.

14. The system of claim 12, wherein one of the at least two outputs provides an output signal corresponding to a normally-open operating mode of the proximity sensor.

15. The system of claim 14, wherein another of the at least two outputs provides an output signal corresponding to a normally-closed operating mode of the proximity sensor.

* * * * *